US 6,804,014 B1

(12) United States Patent
Markle et al.

(10) Patent No.: US 6,804,014 B1
(45) Date of Patent: Oct. 12, 2004

(54) METHOD AND APPARATUS FOR DETERMINING CONTACT OPENING DIMENSIONS USING SCATTEROMETRY (75) Inventors: Richard J. Markle, Austin, TX (US); Kevin R. Lensing, Austin, TX (US); J. Broc Stirton, Austin, TX (US); Marilyn I. Wright, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 188 days.

(21) Appl. No.: 09/897,576

(22) Filed: Jul. 2, 2001

(51) Int. Cl.⁷ .............................................. G01B 11/14
(52) U.S. Cl. ............................. 356/625; 356/394; 438/8
(58) Field of Search ................... 356/601, 237.1–237.6, 356/237, 388, 392, 394, 625; 438/6, 8, 12, 18, 401, 462, 14–16; 250/306; 324/719, 765; 382/145, 151, 174

(56) References Cited

U.S. PATENT DOCUMENTS

| 5,393,624 | A  |   | 2/1995  | Ushijima ...................... 430/30 |
| 5,736,863 | A  | * | 4/1998  | Liu ............................. 324/765 |
| 5,867,276 | A  |   | 2/1999  | McNeil et al. ............... 356/445 |
| 5,880,838 | A  |   | 3/1999  | Marx et al. .................. 356/351 |
| 5,920,067 | A  | * | 7/1999  | Cresswell et al. ........... 250/306 |
| 6,051,348 | A  |   | 4/2000  | Marinaro et al. ............. 430/30 |
| 6,245,584 | B1 |   | 6/2001  | Marinaro et al. ............. 438/14 |
| 6,259,521 | B1 | * | 7/2001  | Miller et al. ............. 356/237.5 |
| 6,316,276 | B1 | * | 11/2001 | Gregory et al. ................ 438/8 |
| 6,327,035 | B1 | * | 12/2001 | Li et al. ....................... 356/630 |
| 6,391,699 | B1 | * | 5/2002  | Madson et al. ............. 438/212 |
| 6,433,878 | B1 |   | 8/2002  | Niu et al. .................... 356/603 |
| 6,436,247 | B1 | * | 8/2002  | Sandhu ........................ 234/719 |
| 6,464,563 | B1 | * | 10/2002 | Lensing ......................... 451/6 |
| 6,486,036 | B1 | * | 11/2002 | Miethke et al. ............. 438/401 |
| 6,489,005 | B1 | * | 12/2002 | Armacost et al. ........... 428/119 |

2002/0135781 A1    9/2002  Singh et al. ................ 356/601

OTHER PUBLICATIONS

Bishop et al., "Use of Scatterometry for resist process control," *SPIE Integrated Circuit Metrology, Inspection and Process Control*, 1673:441–452, 1992.

Hickman et al,, "Use of diffracted light from latent images to improve lithography control," *SPIE Integrated Circuit Metrology, Inspection and Process Control*, 1464:245–257, 1991.

McNeil et al., "Scatterometry applied to microelectronics processing—Part 1," *Solid State Technology*, 37(3):29–56, 1993.

(List continued on next page.)

*Primary Examiner*—Frank G. Font
*Assistant Examiner*—Sang H. Nguyen
(74) *Attorney, Agent, or Firm*—Williams, Morgan & Amerson (57) ABSTRACT

A test structure includes a plurality of lines and a plurality of contact openings defined in the lines. A method for determining contact opening dimensions includes providing a wafer having a test structure comprising a plurality of lines and a plurality of contact openings defined in the lines; illuminating at least a portion of the contact openings with a light source; measuring light reflected from the illuminated portion of the contact openings to generate a reflection profile; and determining a dimension of the contact openings based on the reflection profile. A metrology tool adapted to receive a wafer having a test structure comprising a plurality of lines and a plurality of contact openings defined in the lines includes a light source, a detector, and a data processing unit. The light source is adapted to illuminate at least a portion of the contact openings. The detector is adapted to measure light reflected from the illuminated portion of the contact openings to generate a reflection profile. The data processing unit is adapted to determine a dimension of the contact openings based on the reflection profile.

74 Claims, 5 Drawing Sheets

OTHER PUBLICATIONS

Miller and Mellincamp, "Development of an end–point detection procedure for the post–exposure bake process," *Integrated circuit metrology, inspection, and process control IX: Feb. 20–22, 1995, Santa Clara, California, SPIE Integrated Circuit Metrology, Inspection and Process Control,* 2439:78–88, 1995.

Milner et al., "Latent image exposure monitor using scatterometry," *SPIE Integrated Circuit Metrology, Inspection and Process Control,* 1673:274–283, 1992.

Prins et al., "Scatterometric sensor for PEB process control," *Metrology, inspection, and process control for microlithography, X: Mar., 11–13, 1996, Santa Clara, California, SPIE Integrated Circuit Metrology, Inspection and Process Control,.* 2725:710–719. 1996, Raymond et al., "Multiparameter process metrology using scatterometry," In: *Optical characterization techniques for high–performance microelectronic deivce manufacturing II, SPIE—The International Society for Optical Engineering,* 2638:84–93, Austin, Texas, Oct. 25–26, 1995.

Raymond et al., "Scatterometric sensor for lithography," In: *Manufacturing process control for microelectronic devices and circuits, SPIE—The International Society for Optical Engineering,* 2336:37–49, Austin, Texas, Oct. 20–21, 1994.

Sturtevant et al., "Post–exposure bake as a process–control parameter for chemically–amplified photoresist," *Metrology, inspection and process control for microlithography, VII:2–4, Mar., 1993, Santa Jose, California, SPIE Integrated Circuit Metrology, Inspection and Process Control,.* vol. 1926, 1993.

Sturtevant et al., "Use of scatterometric latent image detector in closed loop feedback control of linewidth," *SPIE Integrated Circuit Metrology, Inspection and Process Control,* 2196:352–359, 1994.

\* cited by examiner

METHOD AND APPARATUS FOR DETERMINING CONTACT OPENING DIMENSIONS USING SCATTEROMETRY

BACKGROUND OF THE INVENTION

1. Field of the Invention

This invention relates generally to the field of semiconductor device manufacturing and, more particularly, to a method and apparatus for determining contact opening dimensions using scatterometry.

2. Description of the Related Art

A conventional integrated circuit device, such as a microprocessor, is typically comprised of many thousands of semiconductor devices, e.g., transistors, formed above the surface of a semiconductive substrate. For the integrated circuit device to function, the transistors must be electrically connected to one another through conductive interconnections. Many modem integrated circuit devices are very densely packed, i.e., there is very little space between the transistors formed above the substrate. Thus, these conductive interconnections must be made in multiple layers to conserve plot space on the semiconductive substrate.

The conductive interconnections are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another.

A contact is generally used to define an interconnection (e.g., using polysilicon or metal) to an underlying polysilicon layer (e.g., source/drain or gate region of a transistor), while a via denotes a metal to metal interconnection. In either case, a contact opening is formed in an insulating layer overlaying the conductive member. A second conductive layer is then formed over the contact opening and electrical communication is established with the conductive member.

Typically contact openings are formed by etching the underlying insulating layer through a patterned layer of photoresist material using an anisotropic etch process. Control of the photoresist patterning and etching processes is important for ensuring the integrity and proper dimensions of the contact opening. If the contact opening dimensions (e.g., size, depth, sidewall profile) are outside of design tolerances, the electrical properties of the subsequently formed contact or via may be compromised.

The present invention is directed to overcoming, or at least reducing the effects of, one or more of the problems set forth above.

SUMMARY OF THE INVENTION

One aspect of the present invention is seen in a test structure including a plurality of lines and a plurality of contact openings defined in the lines.

Another aspect of the present invention is seen in a method for determining contact opening dimensions. The method includes providing a wafer having a test structure comprising a plurality of lines and a plurality of contact openings defined in the lines; illuminating at least a portion of the contact openings with a light source; measuring light reflected from the illuminated portion of the contact openings to generate a reflection profile; and determining a dimension of the contact openings based on the reflection profile.

Yet another aspect of the invention is seen in a metrology tool. The metrology tool is adapted to receive a wafer having a test structure comprising a plurality of lines and a plurality of contact openings defined in the lines. The metrology tool includes a light source, a detector, and a data processing unit. The light source is adapted to illuminate at least a portion of the contact openings. The detector is adapted to measure light reflected from the illuminated portion of the contact openings to generate a reflection profile. The data processing unit is adapted to determine a dimension of the contact openings based on the reflection profile.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
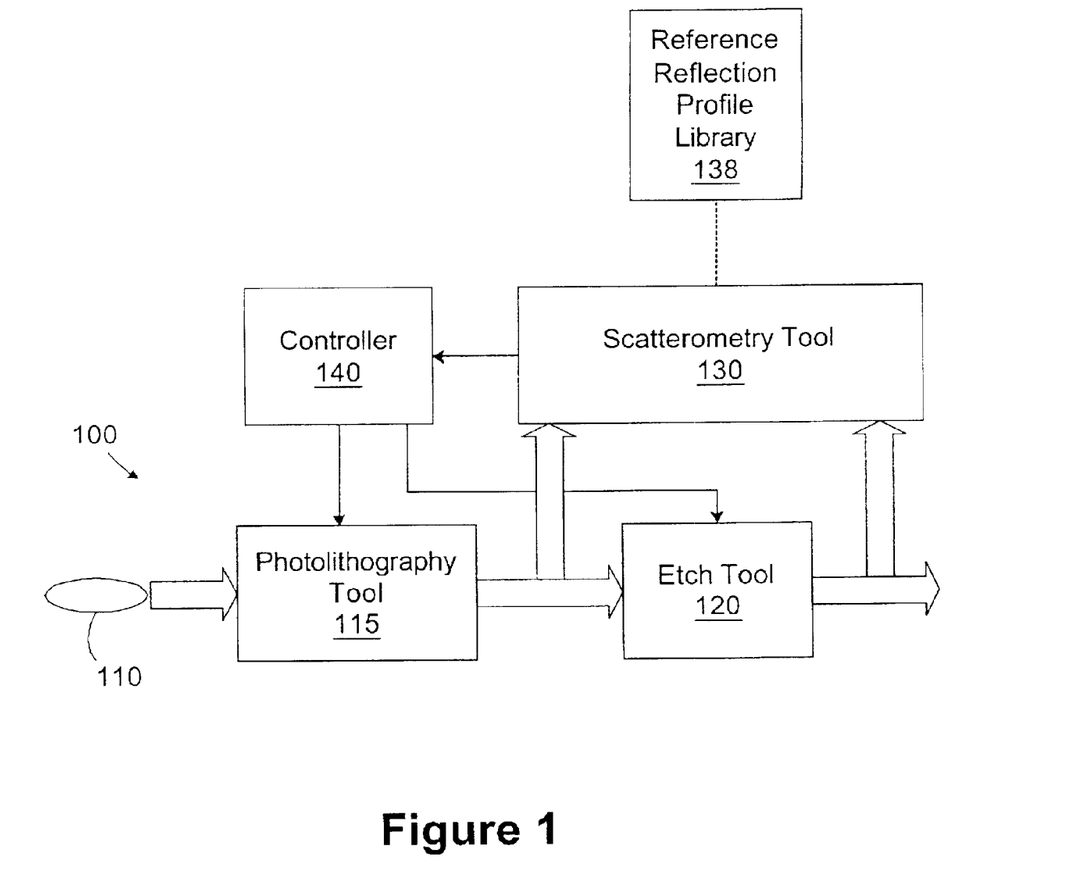
FIG. 1 is a simplified diagram of an illustrative processing line for processing wafers in accordance with one illustrative embodiment of the present invention.

Referring to FIG. 1, a simplified diagram of an illustrative processing line 100 for processing wafers 110 in accordance with one illustrative embodiment of the present invention is provided. The processing line 100 includes a photolithography tool 115 for forming a pattern in a photoresist layer formed on the wafer 110 and an etch tool 120 for etching features of various process layers formed on the wafer 110 using the pattern defined by the photolithography tool 115.

The processing line 100 includes a scatterometry tool 130 adapted to measure dimensions of the features formed in either the photoresist layer or the etched process layer using a test structure 200, 250 (shown in FIGS. 2A and 2B) formed on the wafer 110.

In general, the scatterometry tool 130 includes optical hardware, such as an ellipsometer or reflectometer, and a data processing unit loaded with a scatterometry software application for processing data collected by the optical hardware. For example, the optical hardware may include a model OP5140 or OP5240 with a spectroscopic ellipsometer offered by Therma-Wave, Inc. of Freemont Calif. The data processing unit may comprise a profile application server manufactured by Timbre Technologies, a subsidiary of Tokyo Electron Limited, Inc. of Tokyo, Japan and distributed by Therma-Wave, Inc. The scatterometry tool 130 may be external or, alternatively, the scatterometry tool 130 may be installed in an in-situ arrangement.

A controller 140 is provided for providing feedback to the photolithography tool 115 and/or the etch tool 120 based on the measurements generated by the scatterometry tool 130. The controller 140 adjusts the operating recipe of the controlled tool 115, 120 to improve the photolithography or etching process for subsequently processed wafers 110. The controller 140 may also use the measurements generated by the scatterometry tool 130 for fault detection. If the scatterometry tool 130 measures variation sufficient to significantly degrade the performance of the devices, the wafer may be scrapped or reworked prior to performing any additional process steps.

In the illustrated embodiment, the controller 140 is a computer programmed with software to implement the functions described. However, as will be appreciated by those of ordinary skill in the art, a hardware controller designed to implement the particular functions may also be used. Moreover, the functions performed by the controller 140, as described herein, may be performed by multiple controller devices distributed throughout a system. Additionally, the controller 140 may be a stand-alone controller, it may be integrated into a tool, such as the photolithography tool 115, etch tool 120, or the scatterometry tool 130, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 140, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 2A:
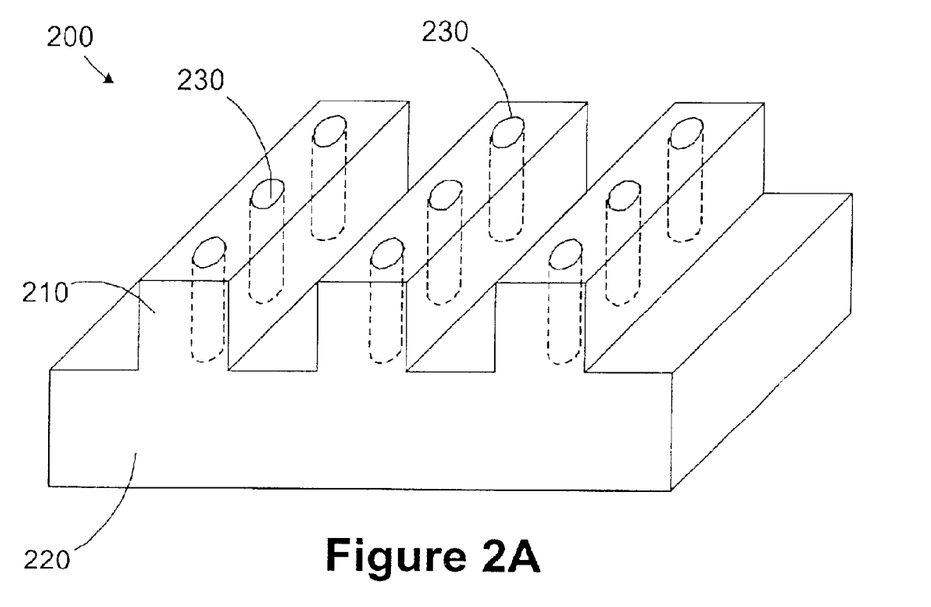
FIGS. 2A and 2B are cross section views of exemplary test structures that may be used in the processing line of FIG. 1.
Figure 2B:
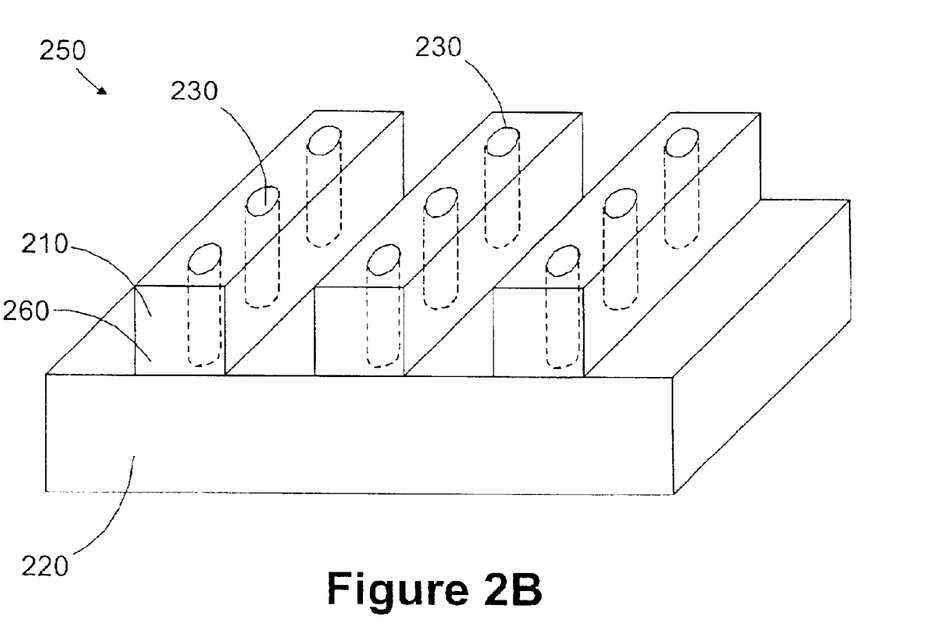

In a typical semiconductor device, the pattern of contact openings evident on the production devices is not in an arrangement that readily allows metrology data to be collected using scatterometry measurements. The test structure 200, 250 provides a repeating grating pattern suitable for measuring using scatterometry. The test structure 200, 250 may be formed in a region of the wafer 110 not normally used for forming devices (e.g., in the periphery region where identification codes are typically scribed or in the scribe lines between production die).

As shown in FIG. 2A, the test structure 200 includes a plurality of lines 210 formed in a base layer 220. Contact openings 230 are formed in the lines 210 in a repeating pattern. In the test structure 250 of FIG. 2B, a second layer 260 is formed over the base layer 220, and the lines 210 are formed in the second layer. The contact openings 230 may be formed during the same process (i.e., photolithography or etch) that is used to form contact openings in the production devices on the wafer 110. The contact openings 230 have the same general construction (e.g., shape, depth, etc.) as features included in contact openings formed in the production devices. In the illustrated embodiment, the contact openings 230 have a round cross-section, although other cross-section shapes (e.g., rectangular) may also be used. The arrangement of contact openings 230 shown in FIGS. 2A and 2B is a row and column arrangement. In other variations, the contact openings 230 may be staggered, i.e., the contact openings 230 in one line are offset from the contact openings 230 in an adjacent line.

The particular material used to form the base layer 230 may vary depending on the particular process being monitored. For example, the base layer 230 may be a photoresist layer used as a mask pattern for etching or an insulative layer, such as silicon dioxide, silicon nitride, silicon oxynitride, and silicon rich oxide. In the illustrated embodiment, the base layer 220 (i.e., in the embodiment of FIG. 2A) and/or the second layer 260 (ie., in the embodiment of FIG. 2B) is an insulating layer (i.e., dielectric constant <5.0). Typically, the insulating material is the same as the material used to form an interlevel dielectric (ILD) layer in the production devices, through which contact openings are to be formed.

Figure 3:
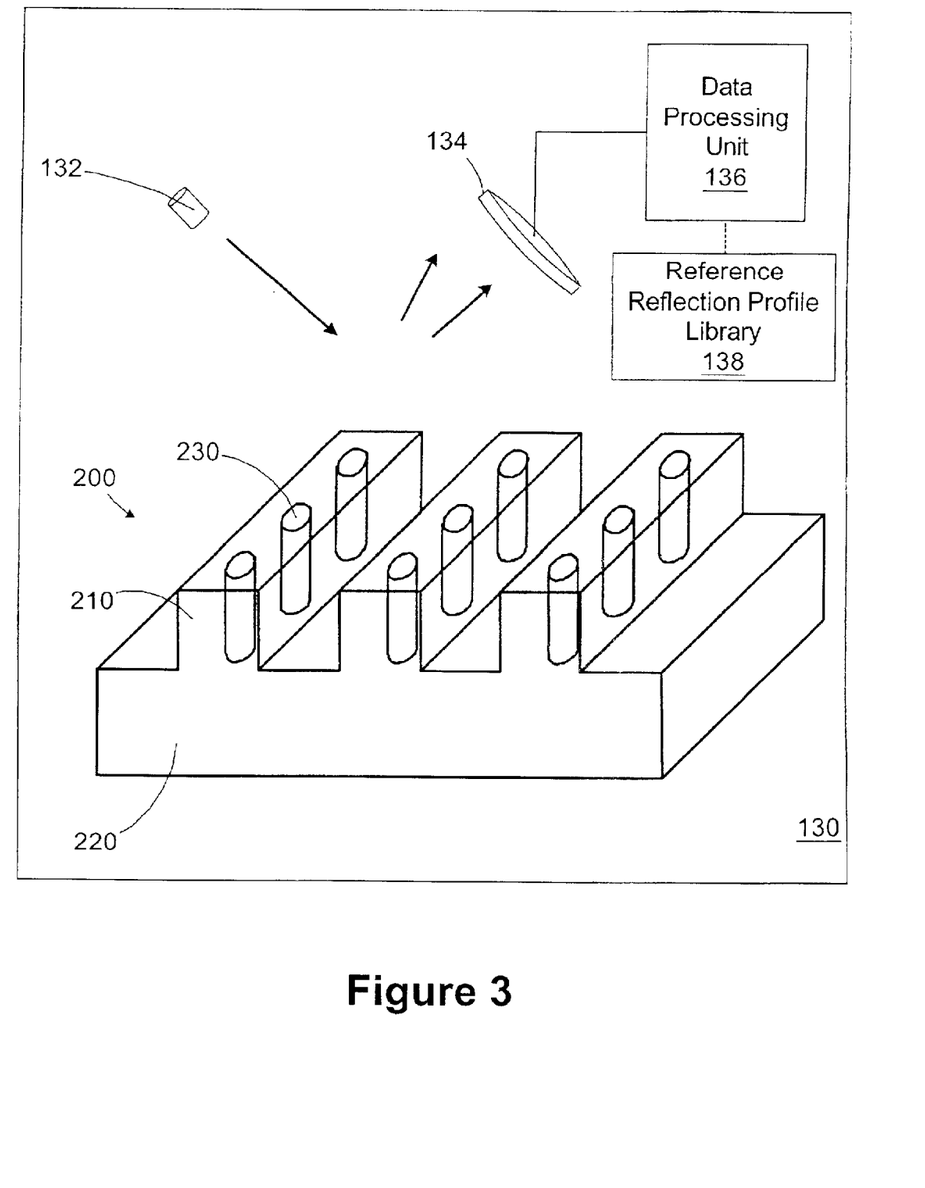
FIG. 3 is a simplified view of the scatterometry tool of FIG. 1.

Turning now to FIG. 3, a simplified view of the scatterometry tool 130 loaded with a wafer 110 having the test structure 200 of FIG. 2A is provided. The test structure of FIG. 2B may also be used. The scatterometry tool 130, includes a light source 132 and a detector 134 positioned proximate the test structure 200. The light source 132 of the scatterometry tool 130 illuminates at least a portion of the test structure 200, and the detector 134 takes optical measurements, such as intensity or phase, of the reflected light. A data processing unit 136 receives the optical measurements from the detector 134 and processes the data to identify dimensions of the contact openings 230.

The scatterometry tool 130 may use monochromatic light, white light, or some other wavelength or combinations of wavelengths, depending on the specific implementation. The angle of incidence of the light may also vary, depending on the specific implementation. The light analyzed by the scatterometry tool 130 typically includes a reflected component (i.e., incident angle equals reflected angle) and a refracted component (i.e., incident angle does not equal the reflected angle). For purposes of discussion here, the term "reflected" light is meant to encompass both components.

Dimensional variations, such as diameter, cross-sectional shape, and sidewall angle, in the contact openings 230 cause changes in the reflection profile (e.g., intensity vs. wavelength—$\tan(\delta)$, phase vs. wavelength—$\cos(\psi)$, where $\delta$ and $\psi$ are common scatterometry outputs known to those of ordinary skill in the art) measured by the scatterometry tool 130 as compared to the light scattering profile that would be present in contact openings 230 having dimensions corresponding to design values, or at least acceptable values.

Figure 4A:
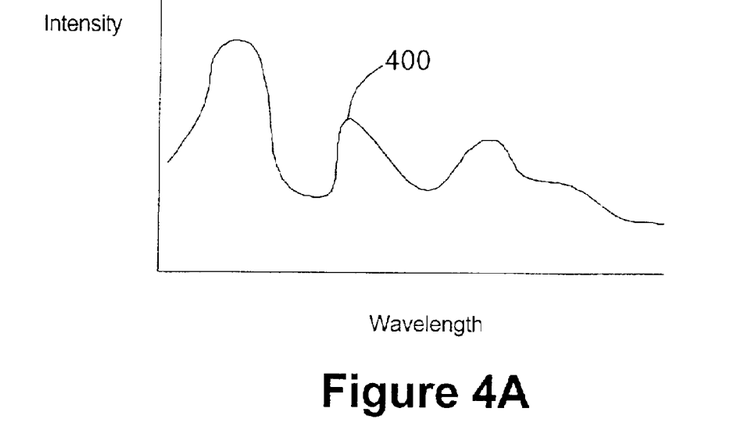
FIGS. 4A, 4B, and 4C illustrate a library of exemplary scatterometry curves used to characterize the wafer measured in the scatterometry tool of FIG. 3.
Figure 4B:
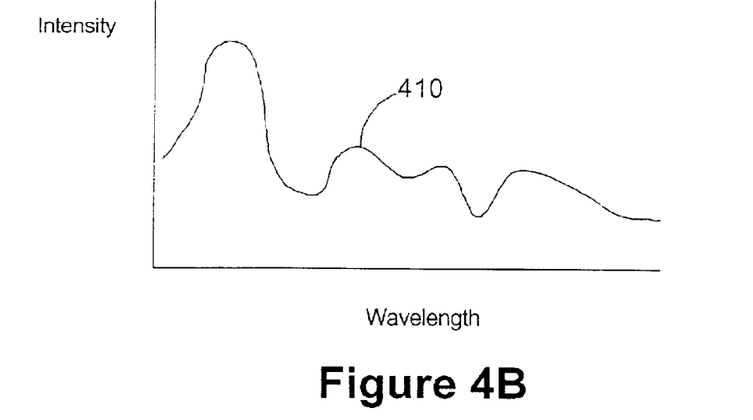
Figure 4C:
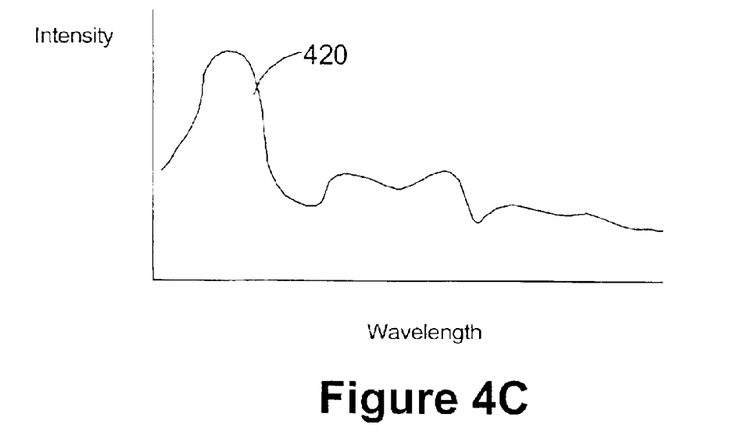

FIGS. 4A, 4B, and 4C illustrate exemplary reflection profiles 400, 410, 420 that may be included in a reference reflection profile library 138 (see FIG. 1) used by the data processing unit 136 to characterize the contact opening dimensions based on the reflection profiles measured by the scatterometry tool 130. The particular reflection profile expected for any structure depends on the specific geometry of the test structure 200 and the parameters of the measurement technique employed by the scatterometry tool 130 (e.g., light bandwidth, angle of incidence, etc.). The profiles in the reference reflection profile library 138 are typically calculated theoretically by employing Maxwell's equations to model individual spectra based on the expected characteristics of the test structure 200. Spectra are generated at a predetermined resolution for many, if not all, profiles that may be expected, and the sum of all said spectra constitute the reference reflection profile library 138. Scatterometry libraries are commercially available from Timbre Technologies, Inc. The profiles in the reference reflection profile library 138 may also be generated empirically by measuring reflection profiles of sample wafers and subsequently characterizing the measured wafers by destructive or non-destructive examination techniques.

The reflection profile 400 of FIG. 4A represents an exemplary profile for a test structure 200 having contact openings 230 with dimensions corresponding to design or target values. The reflection profile 410 of FIG. 4B represents an exemplary profile for a test structure 200 having contact openings 230 that exhibit a slightly smaller than target opening diameter. The reflection profile 420 of FIG. 4C represents an exemplary profile for a test structure 200 having contact openings 230 that exhibit an increasingly smaller opening diameter. The reflection profiles of test structures 200 having contact openings 230 with different amounts of variation may be included in the reference reflection profile library 138. Similarly, reflection profiles may be included that correspond to variations in the depth of the contact openings 230 and the sidewall angle of the contact openings 230.

The data processing unit 136 receives a reflection profile measured by the detector 134 and compares it to the reference reflection profile library 138. Each reference profile has an associated contact opening dimension metric related to the dimensions of the contact openings 230. For example, the contact opening dimension metric may comprise actual diameter, depth, and/or sidewall angle measurements. The data processing unit 136 determines the reference reflection profile having the closest match to the measured reflection profile. Techniques for matching the measured reflection profile to the closest reference reflection profile are well known to those of ordinary skill in the art, so they are not described in greater detail herein. For example, a least squares error technique may be employed.

In another embodiment, the controller 140 or other external controller (not shown) may be adapted to compare the measured reflection profile to the reference reflection profile library 138. In such a case, the scatterometry tool 130 would output the matching reference reflection profile, and the controller 140 may link that reference reflection profile to an associated contact opening dimension metric.

In still another embodiment, the measured reflection profile may be compared to a target reflection profile selected from the reference reflection profile library 138 for a test structure 200 having contact openings 230 exhibiting known and desired dimensions (e.g., the reflection profile 400 of FIG. 4A). For example, a target reflection profile may be calculated for a test structure 200 having contact openings 230 with ideal, or at least acceptable, dimensions using Maxwell's equations, and that target reflection profile may be stored in the reference reflection profile library 138. Thereafter, the measured reflection profile of a test structure 200 with contact openings having unknown dimensions is compared to the target reflection profile. Based upon this comparison, a relatively rough approximation of the dimensions may be determined. That is, by comparing the measured reflection profile to the target reflection profile, the dimensions of the contact openings 230 may be approximated, such that further matching of the measured reflection profile with additional reference reflection profiles from the reference reflection profile library 138 is unwarranted. Using this technique, an initial determination may be made as to the contact opening dimensions. Of course, this step may be performed in addition to the matching or correlating of a measured reflection profile to a reference reflection profile from the reference reflection profile library 138 as described above. The contact opening dimension approximation may also be used to generate a fault detection signal, where a significant deviation in dimensions may result in a later failure or unacceptable performance of the devices in subsequent electrical testing due to the flawed geometry of the contact openings 230.

After receiving the contact opening dimension metric from the scatterometry tool 130, the controller 140 may take a variety of autonomous actions. The actions may include fault detection and/or process control functions. In one embodiment of the present invention, the controller 140 is adapted to modify the operating recipe of the photolithography tool 115 or the etch tool 120 based on the contact opening dimension metric to control operations on subsequently processed wafers. The controller 140 may adjust the recipe for subsequently processed wafers to control the dimensions of the contact openings 230. Photolithography recipe parameters, such as exposure time, exposure dose, depth of focus, resist spin speed, soft bake temperature, post exposure bake temperature, cool plate temperature, developer temperature, focus tilt, etc., or etch recipe parameters, such as the etch time, plasma chemical compositions, RF power, gas flow, chamber temperature, chamber pressure, end-point signal, etc., may be changed to correct sidewall angle deviations or depth variation, for example.

The controller 140 may use a control model of the photolithography tool 115 or the etch tool 120 for determining its operating recipe. For example, the controller 140 may use a control model relating the contact opening dimension metric to a particular operating recipe parameter in the photolithography tool 115 or the etch tool 120 to control the process to correct for dimension variations. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Contact opening dimension models may be generated by the controller 140, or alternatively, they may be generated by a different processing resource (not shown) and stored on the controller 140 after being developed. The contact opening dimension models may be developed using the photolithography tool 115 or the etch tool 120 or using different tools (not shown) having similar operating characteristics. For purposes of illustration, it is assumed that the contact opening dimension models are generated and updated by the controller 140 or other processing resource based on the actual performance of the photolithography tool 115 or the etch tool 120 as measured by the scatterometry tool 130. The contact opening dimension models may be trained based on historical data collected from numerous processing runs of the photolithography tool 115 or the etch tool 120.

The controller 140 may also use the contact opening dimension metric for fault detection. If the amount of contact opening dimension variation measured is sufficient to significantly degrade the performance of the devices, the wafer may be scrapped or reworked prior to performing any additional process steps.

Figure 5:
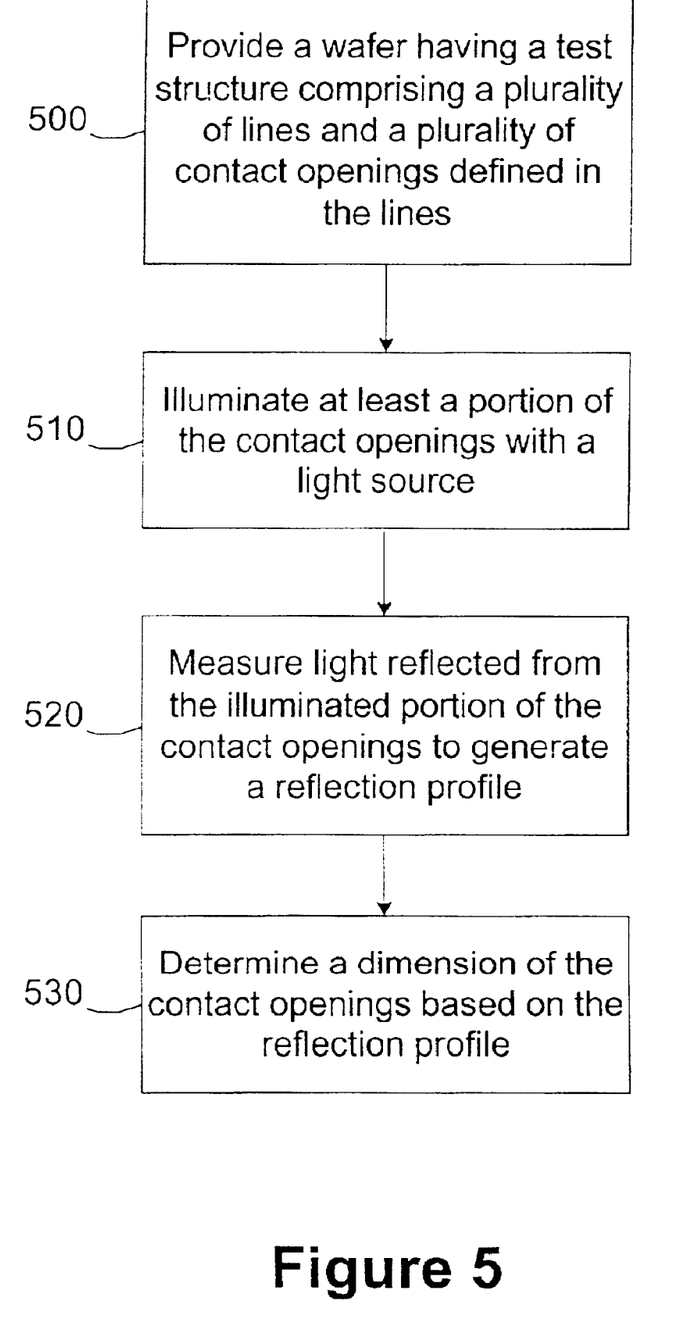
FIG. 5 is a simplified flow diagram of a method for determining contact opening dimensions using scatterometry measurements in accordance with another illustrative embodiment of the present invention.

FIG. 5 is a simplified flow diagram of a method for determining contact opening dimensions using scatterometry measurements in accordance with another illustrative embodiment of the present invention. In block 500, a wafer having a test structure 200, 250 comprising a plurality of lines 210 and a plurality of contact openings 230 defined in the lines is provided. In block 510, at least a portion of the contact openings 230 is illuminated with a light source. In block 520, light reflected from the illuminated portion of the contact openings 230 is measured to generate a reflection profile. In block 530, a dimension (e.g., diameter, depth, sidewall angle) of the contact openings 230 is determined based on the reflection profile.

Monitoring contact opening dimension variations based on measurements from the scatterometry tool 130, as described above, has numerous advantages. The photolithography tool 115 or the etch tool 120 may be controlled to reduce the amount of contact opening dimension variation encountered. Decreased variation reduces the likelihood that a device may be degraded or must be scrapped. Accordingly, the quality of the devices produced on the processing line 100 and the efficiency of the processing line 100 are both increased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for determining contact opening dimensions, comprising:

providing a wafer having a test structure comprising a plurality of lines and a plurality of contact openings defined in the lines;

illuminating at least a portion of the contact openings with a light source;

measuring light reflected from the illuminated portion of the contact openings to generate a reflection profile; and determining a dimension of the contact openings based on the reflection profile.

2. The method of claim 1, wherein determining the dimension of the contact openings further comprises:

comparing the generated reflection profile to a library of reference reflection profiles, each reference reflection profile having an associated contact opening dimension metric;

selecting a reference reflection profile closest to the generated reflection profile; and determining the dimension of the contact openings based on the contact opening dimension metric associated with the selected reference reflection profile.

3. The method of claim 1, further comprising determining at lean one parameter of an operating recipe of a etch tool adapted to etch a subsequent wafer based on the determined contact opening dimension.

4. The method of claim 3, wherein determining at least one parameter of the operating recipe of the etch tool comprises determining at least one of an etch time parameter, a plasma chemical composition parameter, an RF power parameter, a gas flow parameter, a chamber temperature parameter, a chamber pressure parameter, and an end-point signal parameter.

5. The method of claim 1, further comprising determining at least one parameter of an operating recipe of a photolithography tool adapted to process a subsequent wafer based on the determined contact opening dimensions.

6. The method of claim 5, wherein determining at least one parameter of the operating recipe of the photolithography tool comprises determining at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

7. The method of claim 1, wherein generating the reflection profile comprises generating the reflection profile based on at least one of intensity and phase of the reflected light.

8. The method of claim 1, wherein determining the dimension of the contact openings further comprises:

comparing the generated reflection profile to a target reflection profile; and determining the dimension of the contact openings based on the comparison of the generated reflection profile and the target reflection profile.

9. The method of claim 1, further comprising identifying a fault condition associated with the contract openings based on the determined contact opening dimension.

10. The method of claim 1, wherein determining the dimension of the contact openings further comprises determining at least one of a diameter dimension, a depth dimension, and a sidewall angle dimension.

11. The method of claim 1, wherein providing the wafer further comprises providing the wafer having the test structure comprising the plurality of lines and the plurality of contact openings defined in the lines, the contact openings in one line being aligned with die contact openings in an adjacent line.

12. The method of claim 1, wherein providing the wafer further comprises providing the wafer having the test structure comprising the plurality of lines and the plurality of contact openings defined in the lines, the contact openings in one line being offset with respect to the contact openings in an adjacent line.

13. The method of claim 1, wherein providing the wafer having the test structure further comprises providing the wafer having the test structure comprising a plurality of lines each having a width and a plurality of contact openings defined in the lines, each contact opening having a diameter less than the width of the line in which is defined.

14. A method for determining contact opening dimensions, comprising:

providing a wafer having a test structure comprising a plurality of lines and a plurality of contact openings defined in the lines;

illuminating at least a portion of the contact openings with a light source;

measuring light reflected from the illuminated portion of the contact openings to generate a reflection profile;

comparing the generated reflection profile to a library of reference reflection profiles, each reference reflection profile having an associated contact opening dimension metric;

selecting a reference reflection profile closest to the generated reflection profile; and determining a dimension of the contact openings based on the contact opening dimension metric associated with the selected reference reflection profile.

15. The method of claim 14, further comprising determining at least one parameter of an operating recipe of a etch tool adapted to etch a subsequent wafer based on the determined contact opening dimension.

16. The method of claim 13, wherein determining at least one parameter of the operating recipe of the etch tool comprises determining at least one of an etch time parameter, a plasma chemical composition parameter, an RF power parameter, a gas flow parameter, a chamber temperature parameter, a chamber pressure parameter, and an endpoint signal parameter.

17. The method of claim 14, further comprising determining at last one parameter of an operating recipe of a photolithography tool adapted to process a subsequent wafer based on the determined contact opening dimension.

18. The method of claim 17, wherein determining at least one parameter of the operating recipe of the photolithography tool comprises determining at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

19. The method of claim 14, wherein generating the reflection profile comprises generating the reflection profile based on at least one of intensity and phase of the reflected light.

20. The method of claim 14, further comprising identifying a fault condition associated with the contact openings based on the determined contact opening dimension.

21. The method of claim 14, wherein determining the dimension of the contact openings further comprises determining at least one of a diameter dimension, a depth dimension, and a sidewall angle dimension.

22. The method of claim 14, wherein providing the wafer further comprises providing the wafer having the test structure comprising the plurality of lines and the plurality of contact openings defined in the lines, the contact openings in one line being aligned with the contact openings in an adjacent line.

23. The method of claim 14, wherein providing the wafer flier comprises providing the wafer having the test structure comprising the plurality of lines and the plurality of contact openings defined in the lines, the contact openings in one line being offset with respect to the contact openings in an adjacent line.

24. The method of claim 14, wherein providing the wafer having the test structure further comprises providing the wafer having the test structure comprising a plurality of lines each having a width and a plurality of contact openings defined in the lines, each contact opening having a diameter less than the width of the line in which it is defined.

25. A method for determining contact opening dimensions, comprising:

providing a wafer having a test structure comprising a plurality of lines and a plurality of contact openings defined in the lines;

illuminating at least a portion of the contact openings with a light source;

measuring light reflected from the illuminated portion of the contact openings to generate a reflection profile; and comparing the generated reflection profile to a target reflection profile; and determining a dimension of the contact opening based on the comparison of the generated reflection profile and the target reflection profile.

26. The method of claim 25, further comprising determining at least one parameter of an operating recipe of a etch tool adapted to etch a subsequent wafer based on the determined contact opening dimension.

27. The method of claim 26, wherein determining at least one parameter of the operating recipe of the etch tool comprises determining at least one of an etch time parameter, a plasma chemical composition parameter, an RF power parameter, a gas flow parameter, a chamber temperature parameter, a chamber pressure parameter, and an endpoint signal parameter.

28. The method of claim 23, further comprising determining at least one parameter of an operating recipe of a photolithography tool adapted to process a subsequent wafer based on the determined contact opening dimension.

29. The method of claim 28, wherein determining at least one parameter of the operating recipe of the photolithography tool comprises determining at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

30. The method of claim 25, wherein generating the reflection profile comprises generating the reflection profile based on at least one of intensity and phase of the reflected light.

31. The method of claim 25, further comprising identifying a fault condition associated with the contact openings based on the determined contact opening dimension.

32. The method of claim 25, wherein determining the dimension of the contact openings further comprises determining at least one of a diameter dimension, a depth dimension, and a sidewall angle dimension.

33. The method of claim 25, wherein providing the wafer further comprises providing the wafer having the test structure comprising the plurality of lines and the plurality of contact openings defined in the lines, the contact openings of one line being aligned with the contact openings in an adjacent line.

34. The method of claim 25, wherein providing the wafer further comprises providing the wafer having the test structure comprising the plurality of lines and the plurality of contact openings defined in the lines, the contact openings in one line being offset with respect to the contact openings in an adjacent line.

35. The method of claim 25, wherein providing the wafer having the test structure further comprises providing the wafer having the test structure comprising a plurality of lines each having a width and a plurality of contact openings defined in the lines, each contact opening having a diameter less than the width of the line in which it is defined.

36. A metrology tool adapted to receive a wafer having a test structure comprising a plurality of lines and a plurality of contact openings defined in the lines, comprising:
a light source adapted to illuminate at least a portion of the contact openings;
a detector adapted to measure light reflected from the illuminated portion of the contact openings to generate a reflection profile; and
a data processing unit adapted to determine a dimension of the contact openings based on the reflection profile.

37. The metrology tool of claim 36, wherein the data processing unit is further adapted to compare the generated reflection profile to a library of reference reflection profiles, each reference reflection profile having an associated contact opening dimension metric, select a reference reflection profile closest to the generated reflection profile, and determine the dimension of the contact openings based on the contact opening dimension metric associated with the selected reference reflection profile.

38. The metrology tool of claim 36, wherein the detector is further adapted to generate the reflection profile based on at least one of intensity and phase of the reflected light.

39. The metrology tool of claim 36, wherein the metrology tool comprises at comprises at least one of a scatterometer, an ellipsometer, and a reflectometer.

40. The metrology tool of claim 36, wherein the data processing unit is further adapted to compare the generated reflection profile to a target reflection profile and determine the dimension of the contact openings based on the comparison of the general reflection profile and the target reflection profile.

41. The metrology tool of claim 36, wherein the contact openings in one line are aligned with the contact openings in an adjacent line.

42. The metrology tool of claim 36, wherein the contact openings in one line are offset with respect to the contact openings in an adjacent line.

43. The metrology tool of claim 36, wherein each line has a width and each contact opening has a diameter less than the width of the line in which it is defined.

44. A processing line, comprising:
a processing tool adopted to process wafers in accordance with an operating recipe;
a metrology tool adapted to receive a wafer having a test structure comprising a plurality of lines and a plurality of contact openings defined in the lines, the metrology tool comprising:
a light source adapted to illuminate at least a portion of the contact openings;
a detector adapted to measure light reflected from the, illuminated portion of the contact openings to generate a reflection profile; and
a data processing unit adapted to determine a dimension of the contact openings based on the reflection profile; and
a controller adapted to determine at least one parameter of the operating recipe of the processing tool based on the determined contact opening dimension.

45. The processing line of claim 44, wherein the data processing unit is further adapted to compare the generated reflection profile to a library of reference reflection profiles, each reference reflection profile having an associated contact opening dimension metric, select a reference reflection profile closest to the generated reflection profile, and determine the dimension of the contact openings based on the contact opening dimension metric associated with the selected reference reflection profile.

46. The processing line of claim 44, wherein the detector is further adapted to generate the reflection profile based on at least one of intensity and phase of the reflected light.

47. The processing line of claim 44, wherein the metrology tool comprises at least one of a scatterometer, a ellipsometer, and a reflectometer.

48. The processing line of claim 44, wherein the data processing unit is further adapted to compare the generated reflection profile to a target reflection profile and determine the dimension of the contact opening based on the comparison of the generated reflection profile and the target reflection profile.

49. The processing line of claim 44, wherein the processing tool further comprises an etch tool, and the controller is further adapted to determine at least one of an etch time parameter, a plasma chemical composition parameter, an RF power parameter, a gas flow parameter, a chamber temperature parameter, a chamber pressure parameter, and an endpoint signal parameter.

50. The processing line of claim 44, wherein the processing tool further comprises a photolithography tool, and the controller is further adapted to determine at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

51. The processing line of claim 44, wherein the contact openings in one line are aligned with the contact openings in an adjacent line.

52. The processing line of claim 44, wherein the contact openings in one line are offset with respect to the contact openings in an adjacent line.

53. The processing line of claim 44, wherein the controller is further adapted to identify a fault condition associated with the contact openings based on the determined contact opening dimension.

54. The processing line of claim 44, wherein each line has a width and each contact opening has a diameter less than the width of the line in which it is defined.

55. A metrology tool adapted to receive a wafer having a test structure comprising a plurality of lines and a plurality of contact openings defined in the lines, comprising:

a light source adapted to illuminate at least a portion of the contact openings;

a detector adapted to measure light reflected from the illuminated portion or die contact openings to generate a reflection profile; and a data processing unit adapted to compare the generated reflection profile to a library of reference reflection profiles, each reference reflection profile having an associated contact opening dimension metric, select a reference reflection profile closest to the generated reflection profile, and determine a dimension of the contact openings based on the contact opening dimension metric associated with the selected reference reflection profile.

56. The metrology tool of claim 55, wherein each line has a width and each contact opening has a diameter less than the width of the line in which it is defined.

57. A metrology tool adapted to receive a water having a grating structure comprising a plurality of lines, comprising:

a light source adapted to illuminate at least a portion of the contact openings;

a detector adapted to measure light reflected from the illuminated portion of the contact openings to generate a reflection profile; and a data processing unit adapted to compare the generated reflection profile to a target reflection profile and determine a dimension of the contact openings based on the comparison of the generated reflection profile and the target reflection profile.

58. The metrology tool of claim 57, wherein each line has a width and each contact opening has a diameter less than the width of the line in which it is defined.

59. The test structure of claim 57, wherein each line has a width and each contact opening as a diameter less than the width of the line in which it is defined.

60. A test structure, comprising:

a plurality of lines; and a plurality of contact openings defined in the lines.

61. The test structure of claim 60, further comprising a first layer, the lines being defined in the first layer.

62. The test structure of claim 61, wherein the first layer comprises an insulative layer.

63. The test structure of claim 62, wherein the insulative layer comprises at least one of silicone dioxide, silicone nitride, silicone oxynitride, and silicone rich oxide.

64. The test structure of claim 60, further comprising a first layer and a second layer formed over the first layer, the lines being defined in the second layer.

65. The test structure of claim 64, wherein the second layer comprises an insulative layer.

66. The test structure of claim 65, wherein the insulative layer comprises at least one of silicon dioxide, silicon nitride, silicon oxynitride, and silicon rich oxide.

67. The test structure of claim 64, wherein the first layer comprises a photoresist layer.

68. The test structure of claim 60, wherein the contact openings in one line are aligned with the contact openings in an adjacent line.

69. The test structure of claim 68, wherein the second layer comprises a photoresist layer.

70. The test structure of claim 60, wherein the contact openings in one line are of with respect to the contact openings in an adjacent line.

71. A metrology tool, comprising:

means for receiving a wafer having a test structure comprising a plurality of lines and a plurality of contact openings defined in the lines;

means for illuminating at least a portion of the contact opening with a light source;

means for measuring light reflected from the illuminated portion of the contact openings to generate a reflection profile; and means for determining a dimension of the contact openings based on the determined contact opening dimension.

72. The metrology tool of claim 71, further comprising:

means for comparing the generated reflection profile to a library of reference reflection profiles each reference reflection profile having an associated contact opening dimension metric;

means for selecting a reference reflection profile closest to the generated reflection profile; and means for determining the dimension of the contact openings based on the contact opening dimension metric associated with the selected reference reflection profile.

73. The metrology tool of claim 71, further comprising:

means for comparing the generated reflection profile to a target reflection profile; and means for determining the dimension of the contact openings based on the comparison of the generated reflection profile and the target reflection profile.

74. The metrology tool of claim 71, wherein each line has a width and each contact opening has a diameter less than the width of the line in which it is defined.

* * * * *